(12) United States Patent
Otsubo

(10) Patent No.: US 8,884,719 B2
(45) Date of Patent: Nov. 11, 2014

(54) NOISE FILTER DEVICE

(75) Inventor: Masahiro Otsubo, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 13/817,654

(22) PCT Filed: Apr. 18, 2012

(86) PCT No.: PCT/JP2012/060493
§ 371 (c)(1),
(2), (4) Date: Feb. 19, 2013

(87) PCT Pub. No.: WO2013/157098
PCT Pub. Date: Oct. 24, 2013

(65) Prior Publication Data
US 2014/0191823 A1 Jul. 10, 2014

(51) Int. Cl.
| H03H 7/09 | (2006.01) |
| H03H 1/00 | (2006.01) |
| H03H 7/42 | (2006.01) |
| H03H 7/01 | (2006.01) |
| H02M 1/12 | (2006.01) |

(52) U.S. Cl.
CPC ............. *H03H 1/0007* (2013.01); *H03H 7/427* (2013.01); *H03H 7/0115* (2013.01); *H02M 1/126* (2013.01); *H03H 7/0138* (2013.01); *H03H 2001/0085* (2013.01); *H03H 7/09* (2013.01)
USPC .............................. 333/181; 333/12; 333/185

(58) Field of Classification Search
CPC ....... H03H 1/0007; H03H 7/09; H03H 7/427; H03H 7/0115; H03H 7/0138; H03H 2001/0085; H02M 1/126
USPC .................................. 333/12, 167, 181, 185
See application file for complete search history.

(56) References Cited

U.S. PATENT DOCUMENTS

| 5,905,647 A | 5/1999 | Shirai |
| 2006/0128174 A1 | 6/2006 | Jang et al. |
| 2010/0019862 A1* | 1/2010 | Feng et al. .................... 333/181 |

FOREIGN PATENT DOCUMENTS

| DE | 3614333 A1 | 10/1987 |
| DE | 69822682 T2 | 7/2005 |

(Continued)

OTHER PUBLICATIONS

German Office Action for corresponding Application No. 11 2012 002 638.1 issued Jun. 3, 2014.

(Continued)

*Primary Examiner* — Benny Lee
*Assistant Examiner* — Rakesh Patel
(74) *Attorney, Agent, or Firm* — Sughrue Mion, PLLC; Richard C. Turner

(57) ABSTRACT

A noise filter includes a first substrate on which a filter input terminal, an input-side capacitor, a common-mode choke coil, and a filter output terminal are mounted and a second substrate on which an output-side capacitor and a ground capacitor are mounted. The first substrate is selected from a plurality of first substrates including a substrate in which a characteristic of at least one of an input-side capacitor and a common-mode choke coil is different, the second substrate is selected from a plurality of second substrates including a substrate in which a characteristic of at least one of an output-side capacitor and a ground capacitor is different, and the second substrate is attached to an end of the first substrate so that the filter output terminal is electrically connected to the output-side capacitor and to be substantially vertical to the first substrate.

8 Claims, 9 Drawing Sheets

(56) References Cited

FOREIGN PATENT DOCUMENTS

| JP | 57-22272 | U | 2/1982 |
| JP | 61-79557 | U | 5/1986 |
| JP | 4-133493 | A | 5/1992 |
| JP | 7-22886 | A | 1/1995 |
| JP | 10-210761 | A | 8/1998 |
| JP | 2004-364080 | A | 12/2004 |
| JP | 2006-165490 | A | 6/2006 |
| JP | 2011-205211 | A | 10/2011 |

OTHER PUBLICATIONS

International Search Report for PCT/JP2012/060493 dated Jul. 24, 2012.

* cited by examiner

NOISE FILTER DEVICE

CROSS REFERENCE TO RELATED APPLICATIONS

This application is a National Stage of International Application No. PCT/JP2012/060493 filed Apr. 18, 2012, the contents of which are incorporated herein by reference in their entirety.

FIELD

The present invention relates to a noise filter device.

BACKGROUND

A motor drive device including an inverter and the like converts a direct-current voltage into an alternating-current voltage by using a switching operation of a switching element. Therefore, noise (switching noise) is generated by the switching operation of the switching element. This noise propagates to outside via a power supply line to cause influences on devices.

Conventionally, to reduce the influences on a power supply line and the like, a noise filter is inserted and connected between an alternating-current power supply and a motor drive device. In the noise filter, an input-side capacitor, a common-mode choke coil, and an output-side capacitor are connected in this order between the alternating-current power supply and the motor drive device.

Patent Literature 1 describes that, at the time of manufacturing a noise filter inserted between an alternating-current power supply and an electronic device, an input-side capacitor, a common-mode choke coil, and an output-side capacitor are placed on a wiring board having a printed wiring pattern made of conductive foil configured on an insulating layer, cream solder is sandwiched between electrode parts of the respective components and the printed wiring pattern, and a high-temperature heating element is caused to contact an underside of the wiring board. According to Patent Literature 1, it is supposed that the solder is melted and all the components can be soldered at a time.

CITATION LIST

Patent Literature

Patent Literature 1: Japanese Patent Application Laid-open No. H7-22886

SUMMARY

Technical Problem

As means for improving the noise reduction effect of the noise filter device, there is a method of increasing an inductance of a common-mode choke coil and a method of increasing a capacitance of an input-side capacitor and an output-side capacitor.

However, when an inductance L of a coil is excessively increased, the coil tends to be large-sized, and when the coil is large-sized, the noise filter device is also large-sized, so that manufacturing costs of the noise filter device may be increased.

When the capacitance of an input-side capacitor and the output-side capacitor is excessively increased, the capacitors tend to be large-sized. When the capacitors are large-sized, the noise filter device is also large-sized, and there may be another problem such as an increase of a leakage current from a power supply or an inverter to the ground.

Accordingly, to adjust so that the noise reduction effect is improved while suppressing large-sizing of the noise filter device depending on the usage environment of a user and a wiring state, it is required that a balance between the inductance and the capacitance in the noise filter device can be changed on the user's side.

According to the technique of Patent Literature 1, because all the components are soldered on a wiring board before a product is shipped, it is difficult to change the balance between the inductance and the capacitance in the noise filter (the noise filter device) on the user's side.

To effectively reduce noise, a signal including noise needs to pass through a filter with a large attenuance and an input-side circuit unit and an output-side circuit unit of the noise filter device need to be separated from each other on a circuit arrangement.

According to the technique of Patent Literature 1, the wiring board is formed to be considerably long and the input-side capacitor and the output-side capacitor are arranged on the considerably long wiring board to be separated from each other with the common-mode choke coil being interposed therebetween. With this configuration, the noise filter device is large-sized and thus manufacturing costs of the noise filter device may be increased.

The present invention has been achieved in view of the above problems, and an object of the present invention is to provide a noise filter device that can be adjusted on a user's side so that the noise reduction effect is improved while suppressing large-sizing of the noise filter device.

Solution to Problem

There is provided a noise filter device that is inserted and connected between an alternating-current power supply and a motor drive device, the noise filter device comprising: a first substrate on which a filter input terminal, an input-side capacitor, a common-mode choke coil, and a filter output terminal are mounted; and a second substrate on which an output-side capacitor and a ground capacitor are mounted, wherein the first substrate is selected from a plurality of first substrates including a substrate in which a characteristic of at least one of an input-side capacitor and a common-mode choke coil is different, the second substrate is selected from a plurality of second substrates including a substrate in which a characteristic of at least one of an output-side capacitor and a ground capacitor is different, and the second substrate is attached to an end of the first substrate so that the filter output terminal is electrically connected to the output-side capacitor and to be substantially vertical to the first substrate.

Advantageous Effects of Invention

According to the present invention, a second substrate selected from second substrates including a substrate in which a characteristic of at least one of an output-side capacitor and a ground capacitor is different can be attached to a first substrate selected from first substrates including a substrate in which a characteristic of at least one of an input-side capacitor and a common-mode choke coil is different on a user's side, therefore, a balance between inductance values of respective coils and capacitance values of the respective capacitors in a noise filter device can be changed on the user's side. With this configuration, it is possible to make an adjustment on the user's side so that the noise reduction effect is improved while suppressing large-sizing of the noise filter device.

DESCRIPTION OF EMBODIMENTS

Figure 1:
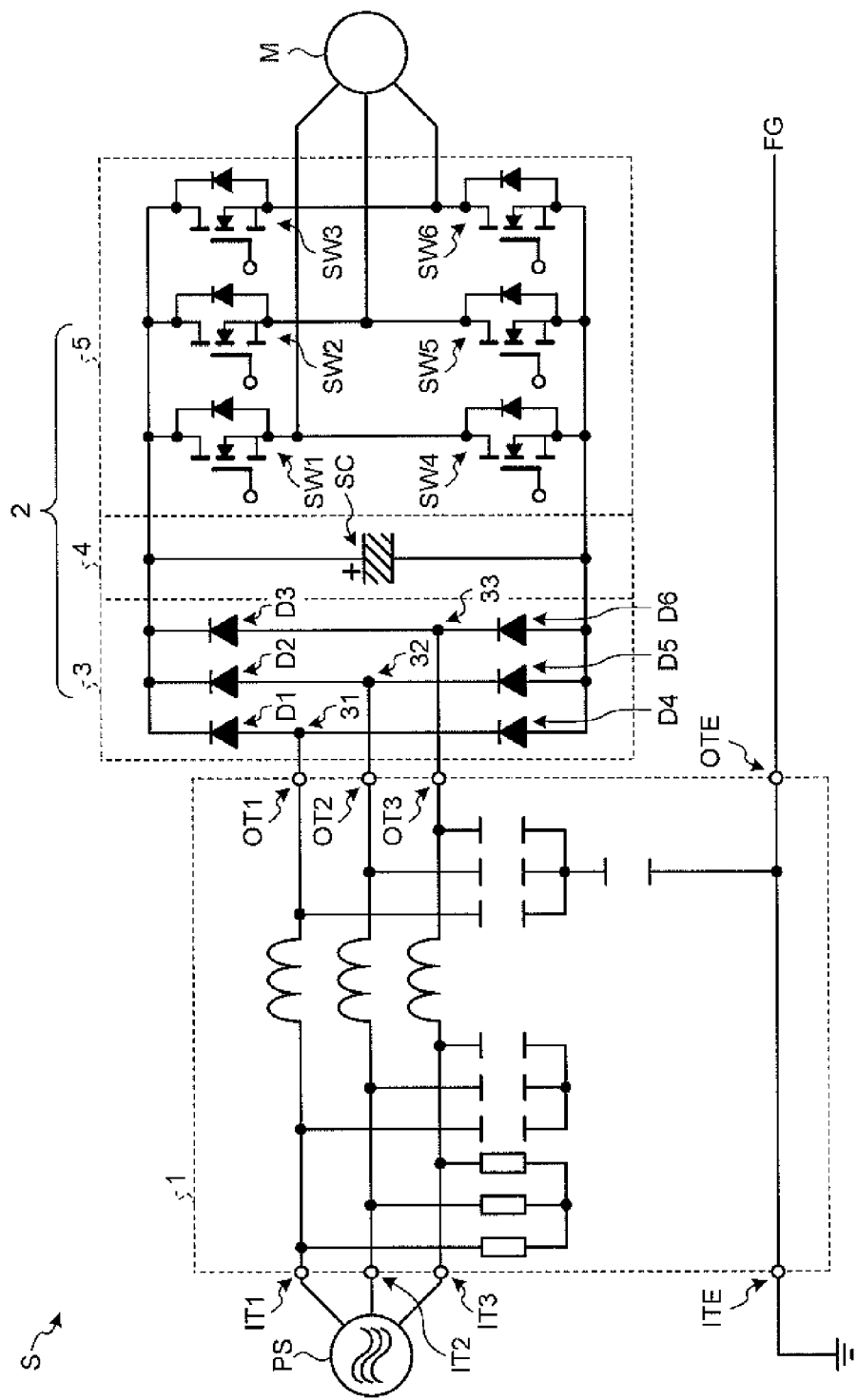
FIG. 1 depicts a configuration of a motor drive system to which a noise filter device according to a first embodiment is applied.

Exemplary embodiments of a noise filter device according to the present invention will be explained below in detail with reference to the accompanying drawings. The present invention is not limited to the embodiments.

First Embodiment

A motor drive system S to which a noise filter device 1 according to a first embodiment is applied is explained first.

The noise filter device 1 is incorporated in the motor drive system S for driving a motor M by using alternating-current power generated by an alternating-current power supply PS, and the noise filter device 1 is provided to reduce noise generated by a motor drive device 2 of the motor drive system S and to be mechanically integrated with the motor drive device 2, for example.

Specifically, in the motor drive system S, the motor drive device 2 includes a rectifying circuit 3, a direct-current intermediate circuit 4, and an inverter 5. The rectifying circuit 3 rectifies alternating-current power received from the alternating-current power supply PS via the noise filter device 1 to generate direct-current power. The rectifying circuit 3 includes a plurality of diodes D1 to D6, which are bridge-connected to each other, for example, and rectifies the alternating-current power by using the diodes D1 to D6 to generate direct-current power. The direct-current intermediate circuit 4 smoothens direct-current power generated by the rectifying circuit 3. For example, the direct-current intermediate circuit 4 includes a smoothing capacitor SC and smoothens the direct-current power by using the smoothing capacitor SC.

The inverter 5 converts the direct-current power smoothened by the direct-current intermediate circuit 4 into alternating-current power. The inverter 5 includes a plurality of switching elements SW1 to SW6 and performs a switching operation by using the switching elements SW1 to SW6 at a predetermined timing, thereby converting the direct-current power into alternating-current power. Each of the switching elements SW1 to SW6 is a transistor such as a MOSFET or an IGBT, and switched on when an active level control signal is supplied to its control terminal (a gate electrode or a base electrode) and switched off when a non-active level control signal is supplied to its control terminal.

At this time, noise is generated by the switching operation of the switching elements SW1 to SW6. This noise propagates to outside via a power supply line connecting the motor drive device 2 to the alternating-current power supply PS and may cause influences on other devices connected to the alternating-current power supply PS.

Accordingly, to reduce the influences on the power-supply line, the noise filter device 1 is conventionally inserted and connected between the alternating-current power supply PS and the motor drive device 2.

Specifically, the noise filter device 1 includes an input terminal unit 1a, a filter input circuit 1b, a filter intermediate circuit 1c, a filter output circuit 1d, and an output terminal unit 1e. The noise filter device 1 is connected via the input terminal unit 1a to the alternating-current power supply PS and via the output terminal unit 1e to the motor drive device 2, thereby being inserted and connected between the alternating-current power supply PS and the motor drive device 2.

The input terminal unit 1a includes filter input terminals IT1 to IT3 of the respective phases and a ground input terminal ITE. The filter input terminals IT1 to IT3 of the respective phases are connected to lines of the respective phases of the alternating-current power supply PS and to lines PL1 to PL3 of the respective phases in the noise filter device 1. The ground input terminal ITE is connected to an external ground potential (see FIG. 1), and to a ground line GL.

The filter input circuit 1b includes a plurality of resistors R1 to R3 and a plurality of input-side capacitors C1 to C3. The respective resistors R1 to R3 are connected to the lines PL1 to PL3 of the respective phases. For example, one end of each of the resistors R1 to R3 is connected to the lines PL1 to PL3 of the corresponding phases and the other end of each of the resistors R1 to R3 is connected to a common connection node RN. The respective input-side capacitors C1 to C3 are connected to the lines PL1 to PL3 of the respective phases. For example, one end of each of the input-side capacitors C1 to C3 is connected to the lines PL1 to PL3 of the corresponding phases and the other end of each of the input-side capacitors C1 to C3 is connected to a common connection node CN1. The filter input circuit 1b receives the alternating-current power from the alternating-current power supply PS via the filter input terminals IT1 to IT3 of the respective phases to transmit the alternating-current power to the filter intermediate circuit 1c.

The filter intermediate circuit 1c includes a plurality of common-mode choke coils L1 to L3. The respective common-mode choke coils L1 to L3 are wound around different parts of a substantially doughnut-shaped toroidal core CR (see FIG. 3) along an arc direction. The filter intermediate circuit 1c transmits the alternating-current power transmitted from the filter input circuit 1b further to the filter output circuit 1d.

The filter output circuit 1d includes a plurality of output-side capacitors C4 to C6 and a ground capacitor C7. The respective output-side capacitors C4 to C6 are connected between the lines PL1 to PL3 of the respective phases and the ground capacitor C7. For example, one end of each of the output-side capacitors C4 to C6 is connected to the lines PL1 to PL3 of the respective phases, and the other end of each of the output-side capacitors C4 to C6 is connected to a common connection node CN2. The ground capacitor C7 is connected between the output-side capacitors C4 to C6 and the ground line GL. For example, one end of the ground capacitor C7 is connected to the common connection node CN2 and the other end thereof is connected to the ground line GL.

The output terminal unit 1e includes filter output terminals OT1 to OT3 of the respective phases and a ground output terminal OTE. The filter output terminals OT1 to OT3 of the respective phases are connected to the lines PL1 to PL3 of the respective phases in the noise filter device 1 and to input terminals 31 to 33 (see FIG. 1) of the respective phases of the rectifying circuit 3. The ground output terminal OTE is connected to the ground line GL in the noise filter device 1 and to, for example, a frame ground FG in the motor drive system S.

At this time, as means for improving the noise reduction effect of the noise filter device 1, there are a method of increasing inductance values of the common-mode choke coils L1 to L3 and a method of increasing capacitance values of the input-side capacitors C1 to C3, the output-side capacitors C4 to C6, and the ground capacitor C7.

However, when the inductance values of the common-mode choke coils L1 to L3 are increased excessively, the common-mode choke coils L1 to L3 tend to be large-sized. When the common-mode choke coils L1 to L3 are large-sized, the noise filter device 1 is also large-sized, so that manufacturing costs of the noise filter device 1 may be increased.

Furthermore, when the capacitance values of the input-side capacitors C1 to C3, the output-side capacitors C4 to C6, and the ground capacitor C7 are increased excessively, the input-side capacitors C1 to C3, the output-side capacitors C4 to C6, and the ground capacitor C7 tend to be large-sized. When the input-side capacitors C1 to C3, the output-side capacitors C4 to C6, and the ground capacitor C7 are large-sized, the noise filter device 1 is also large-sized, and another problem may occur such as an increase of a leakage current from the alternating-current power supply PS or the inverter 5 to the ground (the ground line GL).

Accordingly, to adjust a trade-off between the outline of the noise filter device 1 and the leakage current, that is, to adjust so that the noise reduction effect is improved while suppressing large-sizing of the noise filter device 1 depending on the usage environment of a user and a wiring state, it is required in the noise filter device 1 such that a balance between the inductance values of the respective coils and the capacitance values of the respective capacitors can be changed on the user's side (a first requirement).

It is assumed a case where all components are soldered on a substrate when the noise filter device 1 is manufactured, that is, before the noise filter device 1 is shipped as a product. In this case, because the inductance values of the respective coils and the capacitance values of the respective capacitors in the noise filter device 1 are fixed, it is difficult to change a balance between an inductance and a capacitance in the noise filter device 1 after the product is shipped on the user's side. That is, it is difficult to satisfy the first requirement.

Furthermore, to reduce noise effectively, it is required that a signal including noise is caused to pass through a filter whose attenuance is large with respect to the noise (for example, the common-mode choke coils L1 to L3), and the filter input circuit 1b and the filter output circuit 1d of the noise filter device 1 are separated from each other on a circuit arrangement (a second requirement).

It is assumed a case where the input-side capacitors C1 to C3 are arranged on a very small substrate to be separated from the output-side capacitors C4 to C6 with the common-mode choke coils L1 to L3 being interposed therebetween. In this case, because a distance between the input-side capacitors C1 to C3 and the output-side capacitors C4 to C6 on the substrate is small, the input-side capacitors C1 to C3 may cause influences on the output-side capacitors C4 to C6 via the substrate and thus it is difficult to reduce noise effectively. That is, it is difficult to satisfy the second requirement.

Further, to suppress large-sizing of the noise filter device 1, it is required to arrange the filter input circuit 1b, the filter intermediate circuit 1c, and the filter output circuit 1d of the noise filter device 1 compactly as a whole (a third requirement).

It is assumed a case where a substrate is very long and the input-side capacitor and the output-side capacitor are arranged on the very long substrate to be separated from each other with the common-mode choke coils L1 to L3 being interposed therebetween. In this case, while the distance between the input-side capacitors C1 to C3 and the output-side capacitors C4 to C6 on the substrate can be extended, the substrate tends to be large-sized and the noise filter device 1 also tends to be large-sized, so that manufacturing costs of the noise filter device 1 may be increased. That is, even when the second requirement can be satisfied, it is difficult to satisfy the third requirement.

According to the present embodiment, to satisfy the first requirement, the second requirement, and the third requirement simultaneously, a plurality of first substrates on which common-mode choke coils and input capacitors with different constants are mounted and a plurality of second substrates on which output capacitors and ground capacitors with different constants are mounted are prepared. A first substrate selected from the first substrates and a second substrate selected from the second substrates are then attached so as to be substantially vertical to each other, so that, on the user's side, it is possible to select combinations of required noise filter performance, a leakage current value, and a dimension, and the noise filter device 1 is directed to be downsized while the filter input circuit 1b and the filter output circuit 1c are separated from each other.

Figure 3:
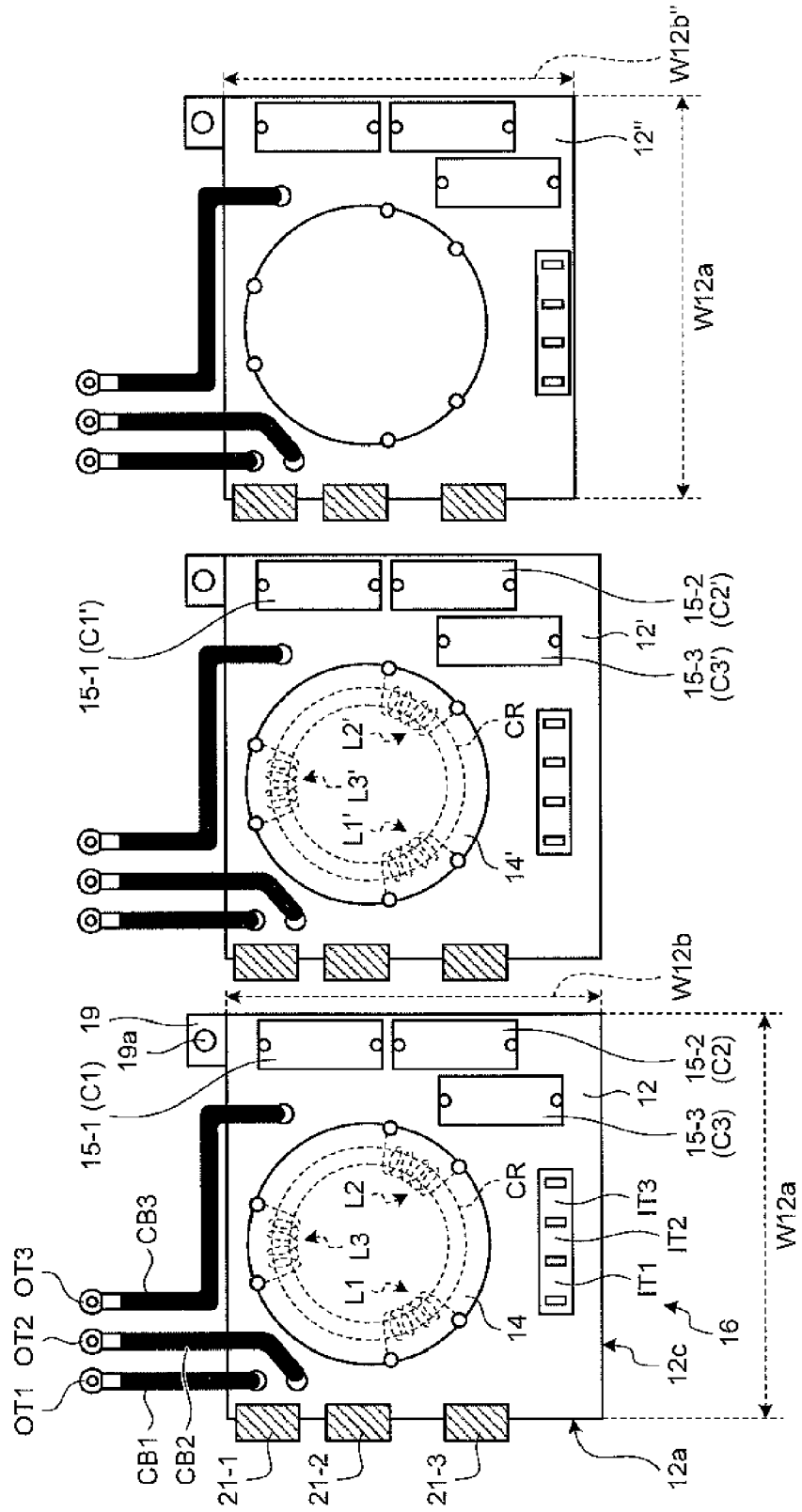
FIG. 3 depicts configurations of first substrates according to the first embodiment.
Figure 4:
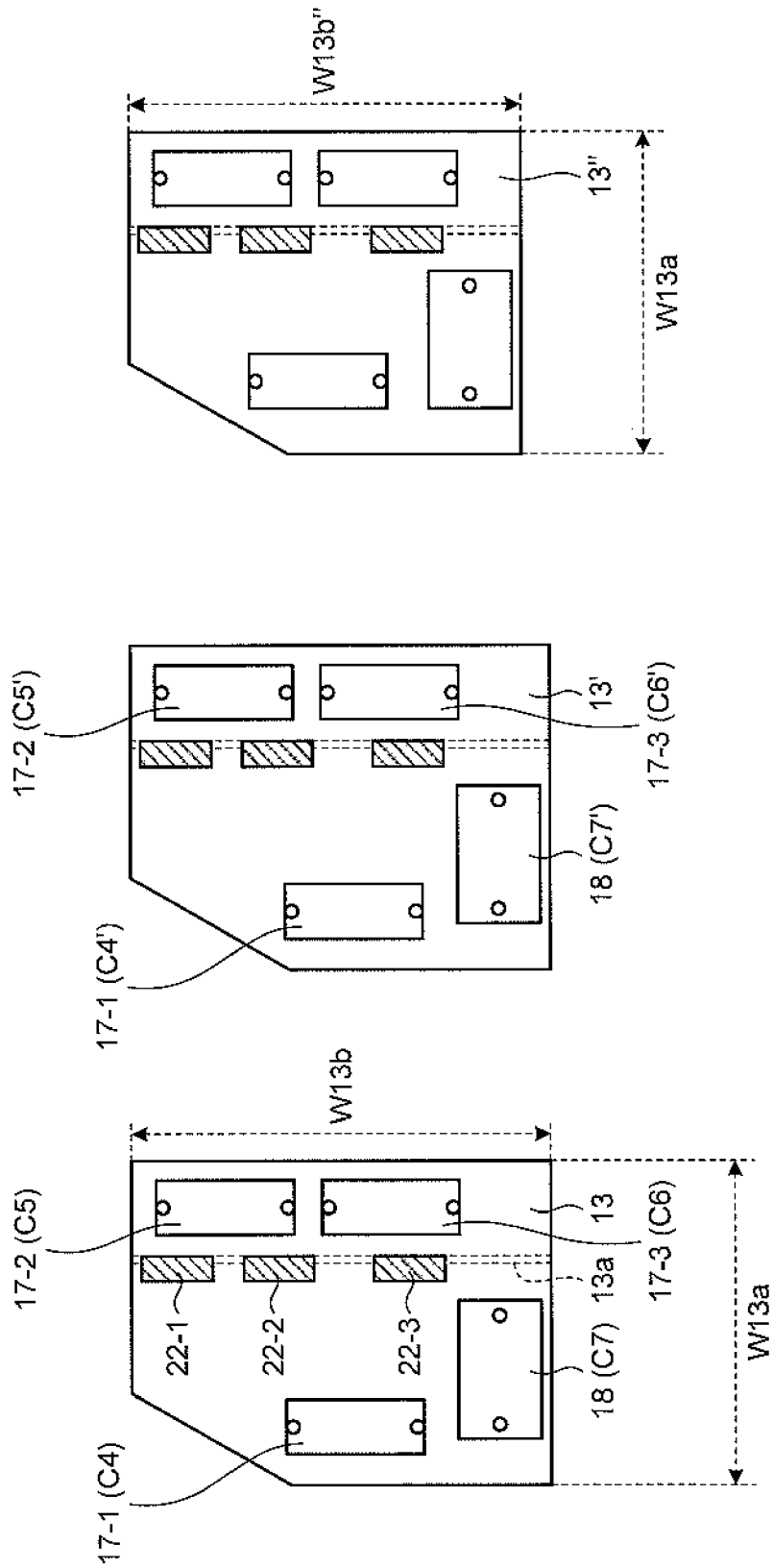
FIG. 4 depicts configurations of second substrates according to the first embodiment.

Specifically, a plurality of first substrates 12, 12', and 12" as shown in FIG. 3 and a plurality of second substrates 13, 13', and 13" as shown in FIG. 4 are prepared.

Figure 2:
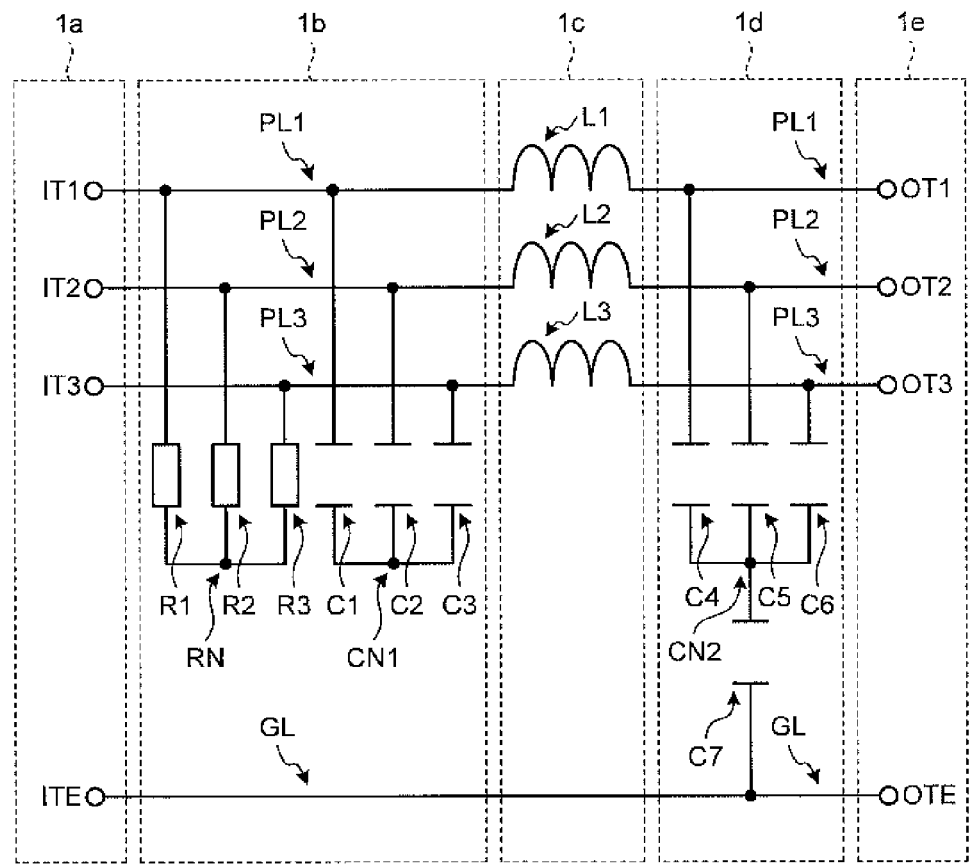
FIG. 2 depicts a circuit configuration of the noise filter device according to the first embodiment.

For example, as shown in FIG. 3, a filter input-terminal block 16, a plurality of packages 15-1 to 15-3, a package 14, and the filter input terminals OT1 to OT3 are mounted on the first substrate 12. The filter input-terminal block 16 includes the filter input terminals IT1 to IT3. In the filter input-terminal block 16, the filter input terminals IT1 to IT3 are aligned along an end 12c of the first substrate 12. The packages 15-1 to 15-3 respectively include the input-side capacitors C1 to C3. For example, the package 14 includes the substantially doughnut-shaped toroidal core CR (see FIG. 3) and the common-mode choke coils L1 to L3 wound around the different parts of the toroidal core CR along the arc direction, as shown by a broken line in FIG. 3(b). That is, the filter input terminals IT1 to IT3, the input-side capacitors C1 to C3, the common-mode choke coils L1 to L3, and the filter output terminals OT1 to OT3 are mounted on the first substrate 12. The first substrate 12 also includes connection terminals 21-1 to 21-3 at an end 12a. At least surfaces of the connection terminals 21-1 to 21-3 are made of a conductor and their conductor parts are electrically connected via a conductive pattern (not shown) on the first substrate 12 and insulating-coated cables CB1 to CB3 to the filter output terminals OT1 to OT3 and via a conductive pattern (not shown) on the first substrate 12 to output ends of the common-mode choke coils L1 to L3 (see FIG. 2). Each of the connection terminals 21-1 to 21-3 has a shape corresponding to connected terminals 22-1 to 22-3 on the second substrate 13 (for example, a convex shape to fit into the connected terminals 22-1 to 22-3) (see FIG. 4). Other first substrates 12' and 12" are identical to the first substrate 12.

On the first substrate 12, as shown in FIG. 3, the filter input-terminal block 16 including the filter input terminals IT1 to IT3 is mounted on a first side (on the lower side of FIG. 3) of the package 14 including the common-mode choke coils L1 to L3 and the filter output terminals OT1 to OT3 are mounted on a second side (on the upper side of FIG. 3) that is opposite to the first side with the package 14 including the common-mode choke coils L1 to L3 being interposed therebetween. On the first substrate 12, the packages 15-1 to 15-3 including the input-side capacitors C1 to C3 are mounted on a third side (on the right side of FIG. 3) of the package 14 including the common-mode choke coils L1 to L3 and the connection terminals 21-1 to 21-3 are provided at the end 12a on a fourth side (on the left side of FIG. 3) that is opposite to the third side with the package 14 including the common-mode choke coils L1 to L3 being interposed therebetween. Other first substrates 12' and 12" are identical to the first substrate 12.

As shown in FIG. 3, the first substrates 12, 12', and 12" serving as candidates to be attached as a part of the noise filter device 1 include a substrate in which a characteristic of at least one of the input-side capacitor and the common-mode choke coil formed thereon is different. For example, the inductance values of the common-mode choke coils L1 to L3 of the first substrate 12 are different from the inductance values of common-mode choke coils L1' to L3' of the first substrate 12'. For example, the capacitance values of the input-side capacitors C1 to C3 of the first substrate 12 are different from capacitance values of input-side capacitors C1' to C3' of the first substrate 12'.

Furthermore, as shown in FIG. 3, the first substrates 12, 12', and 12" serving as candidates to be attached as a part of the noise filter device 1 include a substrate whose dimension is different. For example, in a planar view, while a horizontal width of the first substrate 12 is W12a, which is equal to a horizontal width of the first substrate 12", a vertical width of the first substrate 12 is W12b and a vertical width of the first substrate 12" is W12b", and they are different from each other.

For example, as shown in FIG. 4, a plurality of packages 17-1 to 17-3 and a package 18 are mounted on the second substrate 13. The packages 17-1 to 17-3 respectively include the output-side capacitors C4 to C6. The package 18 includes the ground capacitor C7. That is, the output-side capacitors C4 to C6 and the ground capacitor C7 are mounted on the second substrate 13. The substrate 13 also includes the connected terminals 22-1 to 22-3 in an area 13a to which the first substrate 12 should be connected as shown by a broken line in FIG. 4. At least surfaces of the connected terminals 22-1 to 22-3 are made of a conductor and their conductor parts are electrically connected via a conductive pattern (not shown) on the second substrate 13 to one ends of the output-side capacitors C4 to C6 (see FIG. 2). Each of the connected terminals 22-1 to 22-3 has a shape corresponding to the connection terminals 21-1 to 21-3 on the first substrate 12 (see FIG. 3) (for example, a concave shape to fit into the connection terminals 21-1 to 21-3 such as a through-hole shape). Other second substrates 13' and 13" are identical to the second substrate 13.

As shown in FIG. 4, the second substrates 13, 13', and 13" serving as candidates to be attached as a part of the noise filter device 1 include a substrate in which a characteristic of at least one of the output-side capacitor and the ground capacitor formed thereon is different. For example, the capacitance values of the output-side capacitors C4 to C6 of the second substrate 13 are different from the capacitance values of output-side capacitors C4' to C6' of the second substrate 13'. For example, the capacitance value of the ground capacitor C7 of the second substrate 13 is different from the capacitance value of the ground capacitor C7' of the second substrate 13'.

Furthermore, as shown in FIG. 4, the second substrates 13, 13', and 13" serving as candidates to be attached as a part of the noise filter device 1 include a substrate whose dimension is different. For example, in a planar view, while a horizontal width of the second substrate 13 is W13a, which is equal to a horizontal width of the second substrate 13", a vertical width of the second substrate 13 is W13b and a vertical width of the second substrate 13" is W13b", and they are different from each other.

Figure 5:
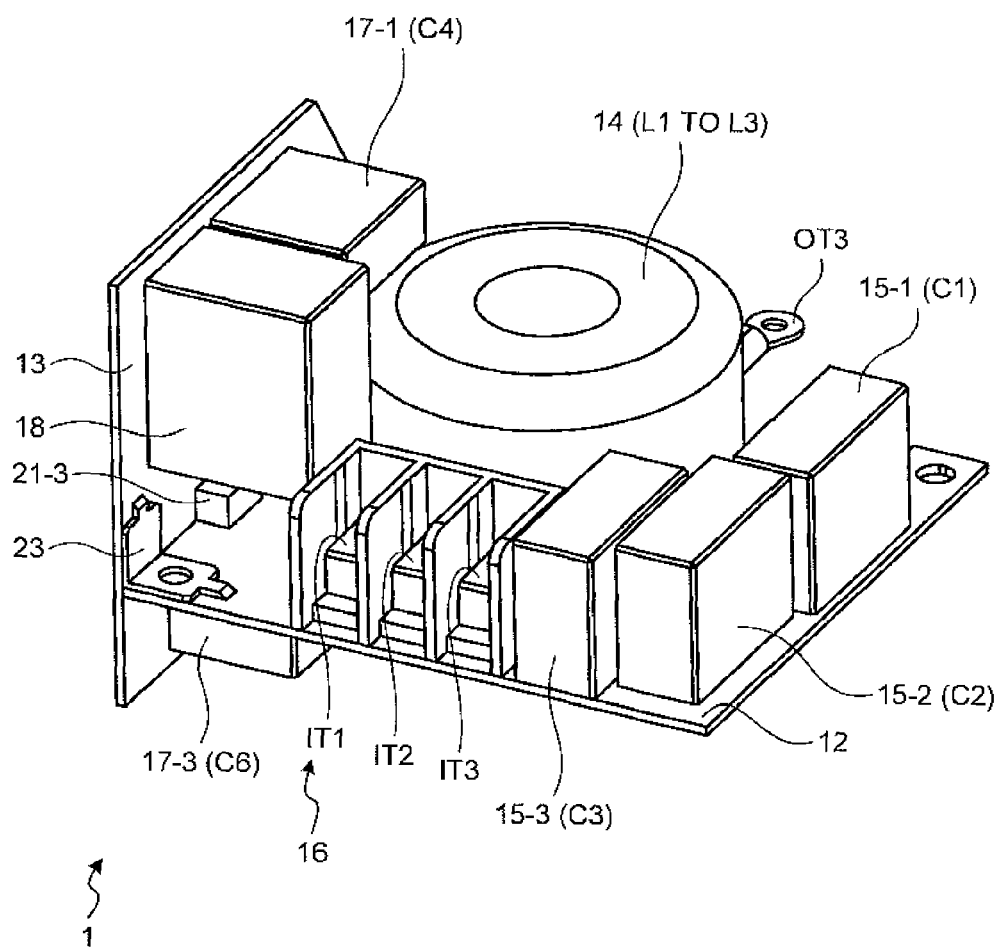
FIG. 5 depicts an external configuration of the noise filter device according to the first embodiment in a mounted state.

Further, for example, one of the first substrates 12, 12', and 12" shown in FIG. 3 is selected and one of the second substrates 13, 13', and 13" shown in FIG. 4 is selected by a user, and then the selected first substrate and the selected second substrate are attached by the user so as to be substantially vertical to each other as shown in FIG. 5. While a case where the first substrate 12 is selected from the first substrates 12, 12', and 12" and the second substrate 13 is selected from the second substrates 13, 13', and 13" is explained below as an example, this explanation is applied to a case where other combinations are selected.

When the area 13a of the second substrate 13 is attached to the end 12a of the first substrate 12, the connection terminals 21-1 to 21-3 of the first substrate 12 are, for example, fitted into the connected terminals 22-1 to 22-3 of the second substrate 13. That is, because the connection terminals 21-1 to 21-3 and the connected terminals 22-1 to 22-3 serve as a guide at the time of attaching the second substrate 13 to the first substrate 12, the second substrate 13 can be easily attached to the first substrate 12 on the user's side.

In a state where the second substrate 13 is attached to the first substrate 12, the filter output terminals OT1 to OT3 are electrically connected via the connection terminals 21-1 to 21-3 and the connected terminals 22-1 to 22-3 to the output-side capacitors C4 to C6. The second substrate 13 is mechanically connected via the connection terminals 21-1 to 21-3 and the connected terminals 22-1 to 22-3 to the end 12a of the first substrate 12 so as to be substantially vertical to the first substrate 12. That is, a connection configuration including the connection terminals 21-1 to 21-3 and the connected terminals 22-1 to 22-3 provides both electrical connection and mechanical connection between the first substrate 12 and the second substrate 13.

To reinforce the mechanical connection between the first substrate 12 and the second substrate 13, for example, the first substrate 12 can be connected to the second substrate 13 also by a plate fixture 23 shown in FIG. 5. Alternatively, the first substrate 12 can be connected to the second substrate 13 by soldering.

Figure 6:
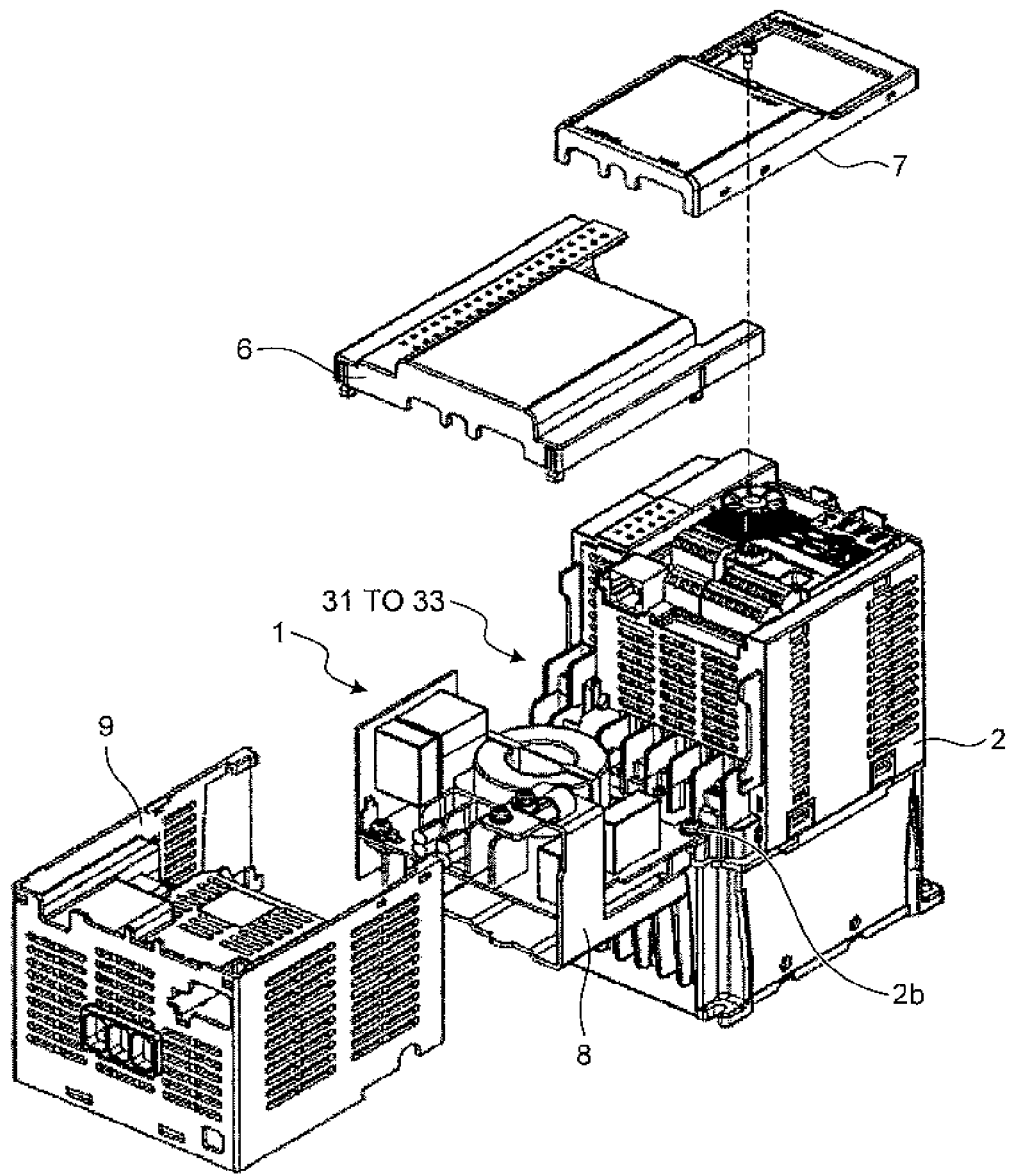
FIG. 6 is an external configuration of the motor drive system to which the noise filter device according to a first embodiment is applied in a mounted state.

For example, as shown in FIG. 6, the noise filter device 1 assembled on the user's side as explained above is incorporated in the motor drive system S by the user and is integrated with, for example, the motor drive device 2.

For example, when the noise filter device 1 is connected to the motor drive device 2, the noise filter device 1 is fixed to a noise-filter support plate 8 by screws and a ground terminal 2b of the motor drive device 2 is connected to a plate fixing hole 19a (see FIG. 3) of a plate fixing fixture 19 of the first substrate 12.

Next, the filter output terminals OT1 to OT3 are connected to the input terminals 31 to 33 (see FIG. 1) of the motor drive device 2, a main body cover 9 is attached to the fixed noise filter device 1, a main body cover 6 is attached to the noise filter device 1 and the motor drive device 2, and finally a front cover 7 is attached to the motor drive device 2.

As explained above, according to the first embodiment, the first substrates 12 to 12" including a substrate in which a characteristic of at least one of the input-side capacitor and the common-mode choke coil formed thereon is different are prepared, and the second substrates 13 to 13" including a substrate in which a characteristic of at least one of the output-side capacitor and the ground capacitor formed thereon is different are prepared. A second substrate (for example, the second substrate 13) selected from the second substrates 13 to 13" is attached to a first substrate (for example, the first substrate 12) selected from the first substrates 12 to 12". With this configuration, the balance between the inductance values of the respective coils and the capacitance values of the respective capacitors in the noise filter device 1 can be changed on the user's side. Accordingly, it is possible to make an adjustment on the user's side such that the noise reduction effect is improved while suppressing large-sizing of the noise filter device.

According to the first embodiment, the first substrate on which the input-side capacitor is mounted is different from the second substrate on which the output-side capacitor is mounted and the second substrate is attached to the end of the first substrate so as to be substantially vertical to the first substrate. Accordingly, the horizontal distance between the filter input terminals IT1 to IT3 and the filter output terminals OT1 to OT3 can be reduced while the input-side capacitors C1 to C3 and the output-side capacitors C4 to C6 are separated from each other on the arrangement. Consequently, the filter input circuit 1b, the filter intermediate circuit 1c, and the filter output circuit 1d (see FIG. 1) of the noise filter device 1 can be arranged compactly as a whole. That is, the noise filter device 1 can be downsized while the filter input circuit 1b and the filter output circuit 1d are separated from each other on the arrangement.

Accordingly, an installation area at the time of incorporating the noise filter device 1 in the motor drive device 2 can be saved and, for example, restrictions of a wire drawing position of the alternating-current power supply PS can be eliminated. Furthermore, by tightly attaching the noise filter device 1 to an input-terminal-unit side of the main body cover 6 of the motor drive system S, the noise filter device 1 can be integrated with the motor drive device 2, and the motor drive system S can be made compact while suppressing an increase in the size of the motor drive system S.

According to the first embodiment, the first substrates 12 to 12" include a substrate whose dimension is different and the second substrates 13 to 13" include a substrate whose dimension is different. That is, it is configured so that at least one of a circuit constant and the dimension of each of the first substrates 12 to 12" and the second substrates 13 to 13" is different, so that it is possible to manufacture a selectable noise filter in which combinations of the noise reduction effect, the leakage current value, and the dimension can be selected on a user's side depending on the necessity of the user. For example, when n types of the first substrate and m types of the second substrate are prepared, n×m noise filter devices in total can be assembled on the user's side, and the range of choice on the user's side can be widened.

Furthermore, according to the first embodiment, the end 12a of the first substrate 12 and a main surface (the area 13a) of the second substrate 13 include the connection terminals 21-1 to 21-3 and the connected terminals 22-1 to 22-3 respectively corresponding to each other. For example, the filter output terminals OT1 to OT3 are electrically connected via the connection terminals 21-1 to 21-3 and the connected terminals 22-1 to 22-3 to the output-side capacitors C4 to C6. For example, the second substrate 13 is mechanically connected via the connection terminals 21-1 to 21-3 and the connected terminals 22-1 to 22-3 to the end 12a of the first substrate 12 so as to be substantially vertical to the first substrate 12. That is, the connection configuration including the connection terminals 21-1 to 21-3 and the connected terminals 22-1 to 22-3 provides both the electrical connection and the mechanical connection between the first substrate 12 and the second substrate 13. Accordingly, the electrical connection and the mechanical connection between the first substrate 12 and the second substrate 13 can be performed efficiently by a less number of components.

According to the first embodiment, for example, on the first substrate 12, the filter input terminals IT1 to IT3 are mounted on the first side of the common-mode choke coils L1 to L3, the filter output terminals OT1 to OT3 are mounted on the second side that is opposite to the first side with the common-mode choke coils L1 to L3 being interposed therebetween, the input-side capacitors C1 to C3 are mounted on the third side of the common-mode choke coils L1 to L3, and the second substrate 13 is attached to the end 12a on the fourth side that is opposite to the third side with the common-mode choke coils L1 to L3 being interposed therebetween. With this configuration, the filter input circuit 1b, the filter intermediate circuit 1c, and the filter output circuit 1d (see FIG. 1) of the noise filter device 1 can be arranged compactly as a whole.

Second Embodiment

A noise filter device 100 according to a second embodiment is explained next. Parts different from the first embodiment are mainly explained below.

While the common-mode choke coils L1 to L3 and the input-side capacitors C1 to C3 are mounted on the same substrate (the second substrate) in the first embodiment, the common-mode choke coils L1 to L3 and the input-side capacitors C1 to C3 are mounted on different substrates in the second embodiment.

Figure 7:
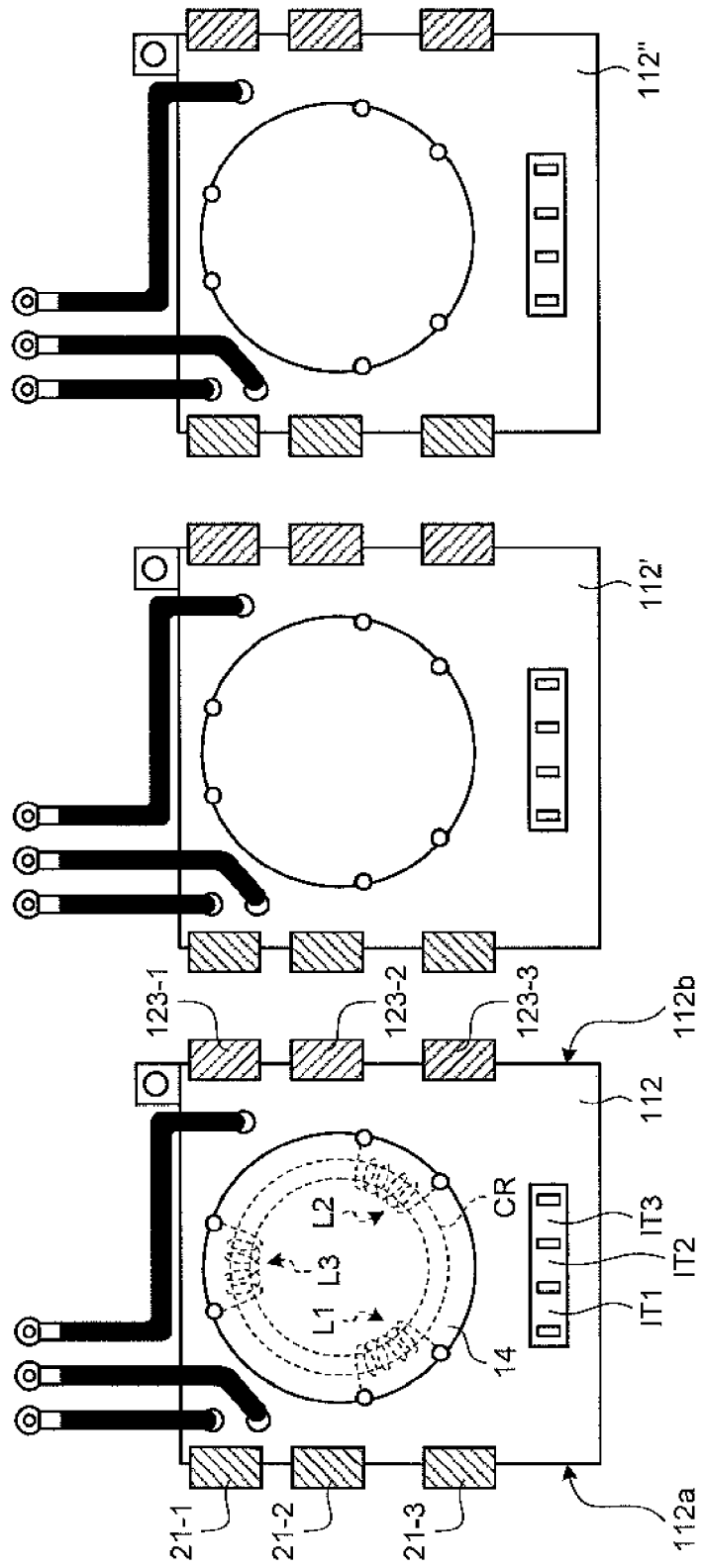
FIG. 7 depicts configurations of first substrates according to a second embodiment.
Figure 8:
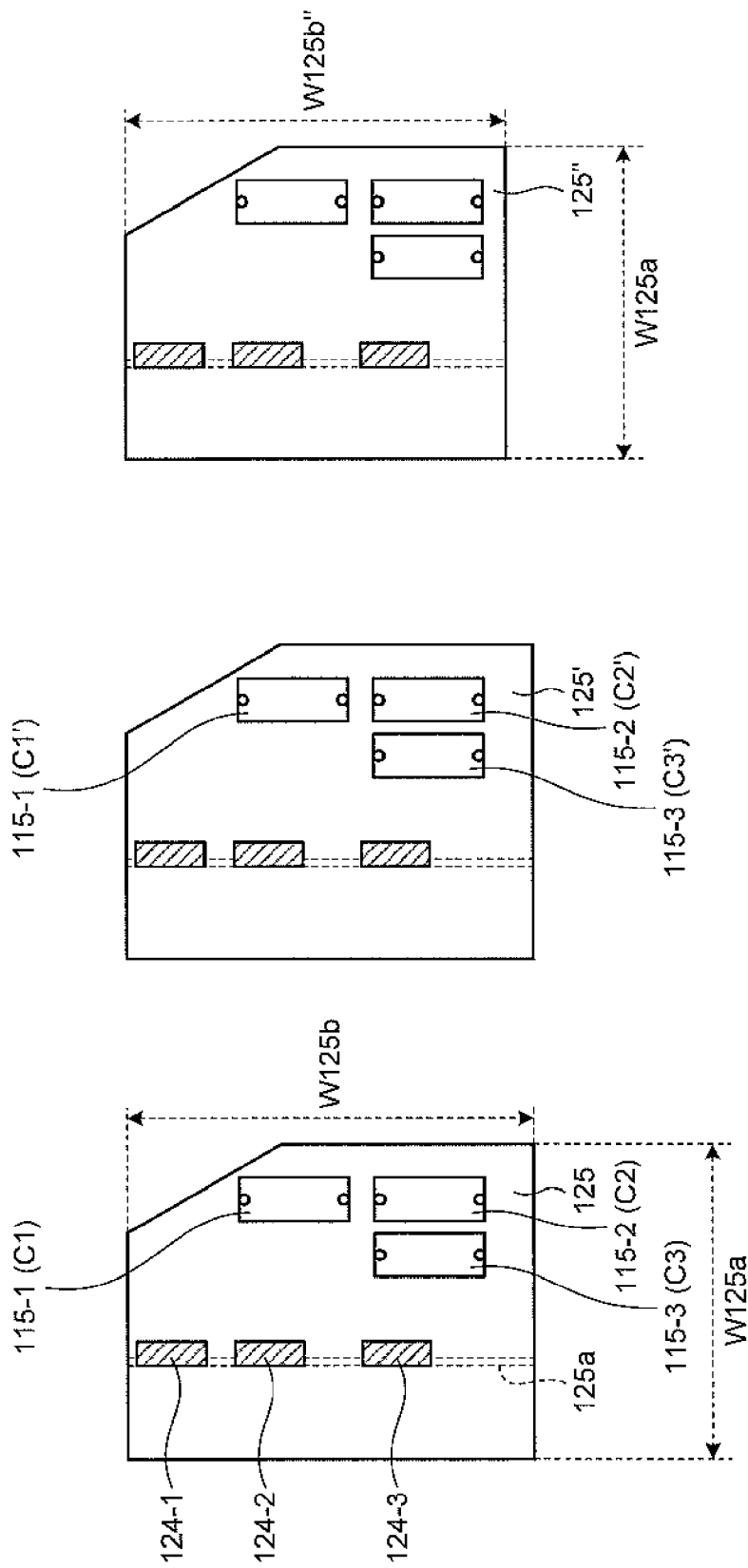
FIG. 8 depicts configurations of third substrates according to the second embodiment.

Specifically, in addition to a plurality of first substrates 112, 112', and 112" shown in FIG. 7 and the second substrates 13, 13', and 13" shown in FIG. 4, a plurality of third substrates 125, 125', and 125" shown in FIG. 8 are prepared.

For example, as shown in FIG. 7, a plurality of packages 115-1 to 115-3 are not mounted on the first substrate 112. The packages 115-1 to 115-3 are not mounted on the first substrate 112 but on the third substrate 125.

The first substrate 112 is also provided with connection terminals (second connection terminals) 123-1 to 123-3 at an end 112b that is opposite to an end 112a at which the connection terminals (first connection terminals) 21-1 to 21-3 are provided. At least surfaces of the connection terminals 123-1 to 123-3 are made of a conductor and their conductor parts are electrically connected via a conductive pattern (not shown) on the first substrate 112 to the filter input terminals IT1 to IT3 and via a conductive pattern (not shown) on the first substrate 112 to input-side ends of the common-mode choke coils L1 to L3 (see FIG. 2). Each of the connection terminals 123-1 to 123-3 has a shape corresponding to connected terminals 124-1 to 124-3 on the third substrate 125 (see FIG. 9) (for example, a convex shape to fit into the connected terminals 124-1 to 124-3). Other first substrates 112' and 112" are identical to as the first substrate 112.

For example, as shown in FIG. 8, the packages 115-1 to 115-3 are mounted on the third substrate 125. The packages 115-1 to 115-3 respectively include the input-side capacitors C1 to C3. That is, the input-side capacitors C1 to C3 are mounted on the third substrate 125. The third substrate 125 also includes the connected terminals 124-1 to 124-3 in an area 125*a* to which the first substrate 112 should be connected as shown by a broken line in FIG. 8. At least surfaces of the connected terminals 124-1 to 124-3 are made of a conductor and their conductor parts are electrically connected via a conductive pattern (not shown) on the third substrate 125 to one ends of the input-side capacitors C1 to C3 (see FIG. 2). Each of the connected terminals 124-1 to 124-3 has a shape corresponding to the connection terminals 123-1 to 123-3 on the first substrate 112 (see FIG. 7) (for example, a concave shape to fit into the connection terminals 123-1 to 123-3 (see FIG. 7) such as a through-hole shape). Other third substrates 125' and 125" are identical to the third substrate 125.

As shown in FIG. 8, the third substrates 125, 125', and 125" serving as candidates to be attached as a part of the noise filter device 100 include a substrate in which a characteristic of at least one of the input side capacitor and the ground capacitor formed thereon is different. For example, the capacitance values of the input-side capacitors C1 to C3 of the third substrate 125 are different from the capacitance values of the input-side capacitors C1' to C3' of the third substrate 125'.

As shown in FIG. 8, the third substrates 125, 125', and 125" serving as candidates to be attached as a part of the noise filter device 100 include a substrate whose dimension is different. For example, in a planar view, while a horizontal width of the third substrate 125 is W125*a*, which is equal to a horizontal width of the third substrate 125", a vertical width of the third substrate 125 is W125*b* and a vertical width of the third substrate 125" is W125*b*", and they are different from each other.

Figure 9:
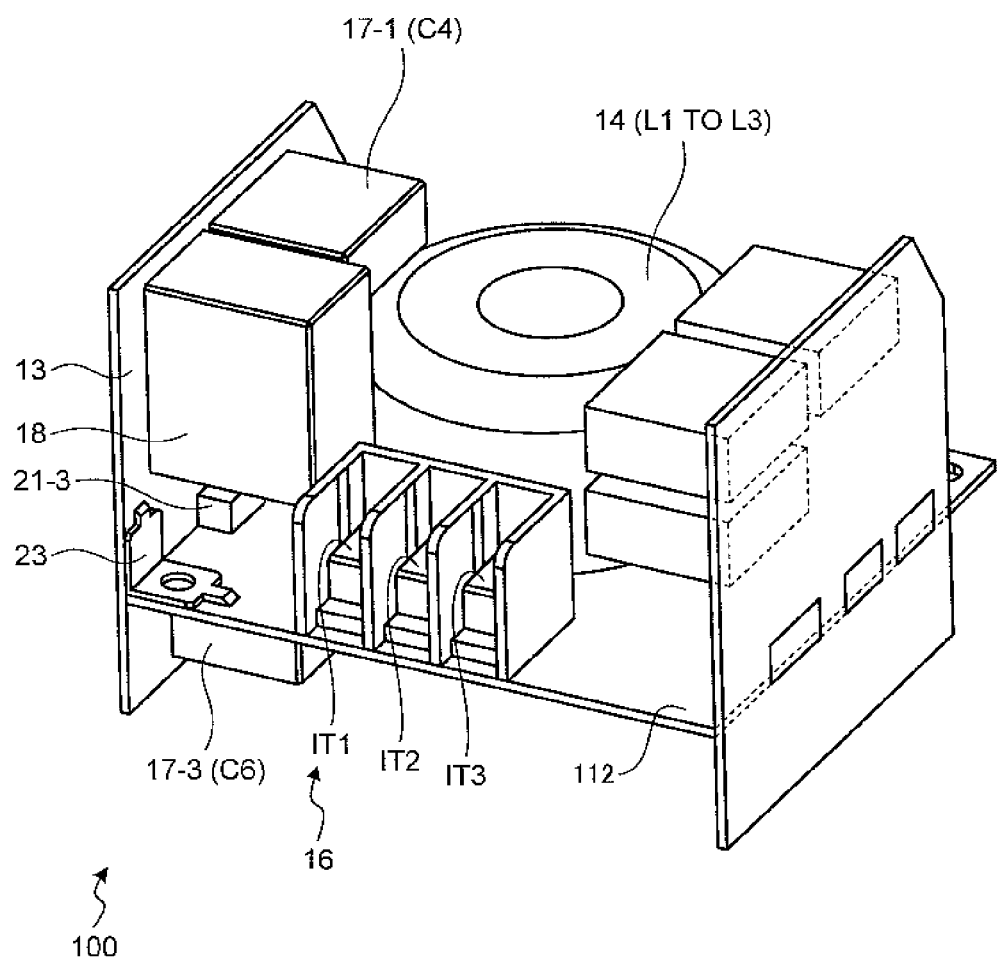
FIG. 9 depicts an external configuration of a noise filter device according to the second embodiment in a mounted state.

Subsequently, one of the first substrates 112, 112', and 112" shown in FIG. 7 is selected, one of the second substrates 13, 13', and 13" shown in FIG. 4 is selected, and one of the third substrates 125, 125', and 125" shown in FIG. 8 is selected by a user. The selected first substrate and the selected third substrate are attached by the user so as to be substantially vertical to each other as shown in FIG. 9. The second embodiment is identical to the first embodiment in that the selected first substrate and the selected second substrate are attached so as to be substantially vertical to each other. While a case where the first substrate 112 is selected from the first substrates 112, 112', and 112", the second substrate 13 is selected from the second substrates 13, 13', and 13", and the third substrate 125 is selected from the third substrates 125, 125', and 125" is explained below as an example, this explanation is applied to a case where other combinations are selected.

When the area 125*a* of the third substrate 125 is attached to the end 112*b* of the first substrate 112, the connection terminals 123-1 to 123-3 of the first substrate 112 are, for example, fitted into the connected terminals 124-1 to 124-3 of the third substrate 125. That is, because the connection terminals 123-1 to 123-3 and the connected terminals 124-1 to 124-3 serve as a guide at the time of attaching the third substrate 125 to the first substrate 112, the third substrate 125 can be easily attached to the first substrate 112 on a user's side.

In a state where the third substrate 125 is attached to the first substrate 112, the filter input terminals IT1 to IT3 are electrically connected via the connection terminals 123-1 to 123-3 and the connected terminals 124-1 to 124-3 to one ends of the input-side capacitors C1 to C3. The third substrate 125 is mechanically connected via the connection terminals 123-1 to 123-3 and the connected terminals 124-1 to 124-3 to the end 112*b* of the first substrate 112 so as to be substantially vertical to the first substrate 112. That is, a connection configuration including the connection terminals 123-1 to 123-3 and the connected terminals 124-1 to 124-3 provides both electrical connection and mechanical connection between the first substrate 112 and the third substrate 125.

As explained above, according to the second embodiment, in addition that the first substrates 112 to 112" including a substrate in which a characteristic of the common-mode choke coil formed thereon is different are prepared, and the second substrates 13 to 13" including a substrate in which a characteristic of at least one of the output-side capacitor and the ground capacitor formed thereon is different are prepared, the third substrates 125 to 125" including a substrate in which a characteristic of the input-side capacitor formed thereon is different are prepared. A second substrate (for example, the second substrate 13) selected from the second substrates is attached to a first substrate (for example, the first substrate 112) selected from the first substrates and a third substrate (for example, the third substrate 125) selected from the third substrates 125 to 125" is attached to the first substrate. Consequently, according to the noise filter device 100, flexibility at the time of changing a balance between the inductance values of the respective coils and the capacitance values of the respective capacitors on the user's side can be further improved, and it is possible to make a further adjustment easily on the user's side such that the noise reduction effect is improved while suppressing large-sizing the noise filter device.

According to the second embodiment, the third substrate on which the input-side capacitor is mounted and the second substrate on which the output-side capacitor is mounted are different from each other. The second substrate is attached to the end of the first substrate so as to be substantially vertical to the first substrate and the third substrate is attached to the opposite end of the first substrate so as to be substantially vertical to the first substrate. Accordingly, the filter input circuit 1*b*, the filter intermediate circuit 1*c*, and the filter output circuit 1*d* (see FIG. 1) of the noise filter device 100 can be arranged more compactly as a whole while the input-side capacitors C1 to C3 and the output-side capacitors C4 to C6 are separated from each other on the arrangement. That is, the noise filter device 100 can be further downsized while the filter input circuit 1*b* and the filter output circuit 1*d* are separated from each other on the arrangement.

According to the second embodiment, the first substrates 112 to 112" include a substrate whose dimension is different. The second substrates 13 to 13" include a substrate whose dimension is different. The third substrates 125 to 125" include a substrate whose dimension is different. That is, it is configured so that at least one of the circuit constant and the dimension of each of the first substrates 112 to 112", the second substrates 13 to 13", and the third substrates 125 to 125" is different, so that it is possible to manufacture a selectable noise filter in which combinations of the noise reduction effect, the leakage current value, and the dimension can be selected on the user's side with higher flexibility. For example, when n types of the first substrate, m types of the second substrate, and p types of the third substrate are prepared, n×m×p noise filter devices in total can be assembled on the user's side, and the range of choice on the user's side can be further widened.

According to the second embodiment, the end 112*b* of the first substrate 112 and a main surface (the area 125*a*) of the third substrate 125 include the connection terminals 123-1 to 123-3 and the connected terminals 124-1 to 124-3 respectively corresponding to each other. For example, the filter input terminals IT1 to IT3 are electrically connected via the connection terminals 123-1 to 123-3 and the connected terminals 124-1 to 124-3 to one ends of the input-side capacitors C1 to C3. For example, the third substrate 125 is mechanically connected via the connection terminals 123-1 to 123-3 and the connected terminals 124-1 to 124-3 to the end 112b of the first substrate 112 so as to be substantially vertical to the first substrate 112. That is, the connection configuration including the connection terminals 123-1 to 123-3 and the connected terminals 124-1 to 124-3 provides both the electrical connection and the mechanical connection between the first substrate 112 and the third substrate 125. Accordingly, the electrical connection and the mechanical connection between the first substrate 112 and the third substrate 125 can be performed efficiently by a less number of components.

According to the second embodiment, on the first substrate 112, the filter input terminals IT1 to IT3 are mounted on the first side of the common-mode choke coils L1 to L3, the filter output terminals OT1 to OT3 are mounted on the second side that is opposite to the first side with the common-mode choke coils L1 to L3 being interposed therebetween, the third substrate 125 is attached to the end 112b on the third side of the common-mode choke coils L1 to L3, and the second substrate 13 is attached to the end 112a on the fourth side that is opposite to the third side with the common-mode choke coils L1 to L3 being interposed therebetween. With this configuration, the filter input circuit 1b, the filter intermediate circuit 1c, and the filter output circuit 1d (see FIG. 1) of the noise filter device 100 can be arranged more compactly as a whole.

INDUSTRIAL APPLICABILITY

As described above, the noise filter device according to the present invention is useful for reducing switching noise.

REFERENCE SIGNS LIST 1 noise filter device
2 motor drive device
3 rectifying circuit
4 direct-current intermediate circuit
5 inverter
6 main body cover
8 noise-filter support plate
9 main body cover
12 to 12" first substrate
13 to 13" second substrate
14 package
15-1 to 15-3 package
16 filter input-terminal block
17-1 to 17-3 package
18 package
19 plate fixing hole
21-1 to 21-3 connection terminal
22-1 to 22-3 connected terminal
27 plate fixture
31 to 33 input terminal
100 noise filter device
112 to 112" first substrate
115-1 to 115-3 package
123-1 to 123-3 connection terminal
124-1 to 124-3 connected terminal
125 to 125" third substrate
C1 to C3, C1' to C3' input-side capacitor
C4 to C6, C4' to C6' output-side capacitor
C7 ground capacitor
IT1 to IT3 filter input terminal
L1 to L3 common-mode choke coil
OT1 to OT3 filter output terminal

The invention claimed is:

1. A noise filter device that is inserted and connected between an alternating-current power supply and a motor drive device, the noise filter device comprising:
a first substrate on which a filter input terminal, an input-side capacitor, a common-mode choke coil, and a filter output terminal are mounted; and
a second substrate on which an output-side capacitor and a ground capacitor, connected between the output-side capacitor and a ground, are mounted, wherein
the first substrate is selected from a plurality of first substrates, wherein the selected first substrate comprises at least one of the input-side capacitor and the common-mode choke coil having a characteristic different from an input-side capacitor and a common-mode choke coil of other first substrates,
the second substrate is selected from a plurality of second substrates, wherein the selected second substrate comprises at least one of the output-side capacitor and the ground capacitor having a characteristic different from an output-side capacitor and a ground capacitor of other second substrates, and
the second substrate is attached to an end of the first substrate so that the filter output terminal is electrically connected to the output-side capacitor and is substantially vertical to the first substrate.

2. The noise filter device according to claim 1, wherein
the plurality of first substrates includes the selected first substrate whose dimension is different from the other first substrates, and
the plurality of second substrates includes a substrate whose dimension is different from the other second substrates.

3. The noise filter device according to claim 1, wherein
the end of the first substrate and a main surface of the second substrate include a connection terminal and a connected terminal respectively,
the filter output terminal is electrically connected via the connection terminal and the connected terminal to the output-side capacitor, and
the second substrate is mechanically connected via the connection terminal and the connected terminal to the end of the first substrate to be substantially vertical to the first substrate.

4. The noise filter device according to claim 1, wherein the common-mode choke coil comprises a first side, a second side, a third side, and a fourth side, wherein, on the first substrate, the filter input terminal is mounted on the first side, the filter output terminal is mounted on the second side that is opposite to the first side, the input-side capacitor is mounted on the third side, and the second substrate is attached to the end on the fourth side that is opposite to the third side.

5. A noise filter device that is inserted and connected between an alternating-current power supply and a motor drive device, the noise filter device comprising:
a first substrate on which a filter input terminal, a common-mode choke coil, and a filter output terminal are mounted;
a second substrate on which an output-side capacitor and a ground capacitor are mounted; and
a third substrate on which an input-side capacitor is mounted, wherein
the first substrate is selected from a plurality of first substrates, wherein the selected first substrate comprises the common-mode choke coil having a characteristic different from a common-mode choke coil of other first substrates, the second substrate is selected from a plurality of second substrates, wherein the selected second substrate comprises at least one of the output-side capacitor and the ground capacitor having a characteristic different from an output-side capacitor and a ground capacitor of other second substrates, the third substrate is selected from a plurality of third substrates, wherein the selected third substrate comprises the input-side capacitor having a characteristic different from an input-side capacitor of other third substrates, the second substrate is attached to a first end of the first substrate so that the filter output terminal is electrically connected to the output-side capacitor and is substantially vertical to the first substrate, and the third substrate is attached to a second end of the first substrate opposite to the second substrate so that the filter input terminal is electrically connected to the input-side capacitor and is substantially vertical to the first substrate.

6. The noise filter device according to claim 5, wherein the plurality of first substrates include the selected first substrate whose dimension is different from the other first substrates, the second substrates include the selected second substrate whose dimension is different from the other second substrates, and the plurality of third substrates include the selected third substrate whose dimension is different from the other third substrates.

7. The noise filter device according to claim 5, wherein the first end of the first substrate and a main surface of the second substrate include a first connection terminal and a first connected terminal respectively, the filter output terminal is electrically connected via the first connection terminal and the first connected terminal to the output-side capacitor, the second substrate is mechanically connected via the first connection terminal and the first connected terminal to the first end of the first substrate to be substantially vertical to the first substrate, the second end of the first substrate and a main surface of the third substrate include a second connection terminal and a second connected terminal respectively corresponding to each other, the filter input terminal is electrically connected via the second connection terminal and the second connected terminal to the input-side capacitor, and the third substrate is mechanically connected via the second connection terminal and the second connected terminal to the second end of the first substrate to be substantially vertical to the first substrate.

8. The noise filter device according to claim 5, wherein the common-mode choke coil comprises a first side, a second side, a third side, and a fourth side, wherein, on the first substrate, the filter input terminal is mounted on the first side, the filter output terminal is mounted on the second side that is opposite to the first side, the third substrate is attached to the second end on the third side, and the second substrate is attached to the first end on the fourth side that is opposite to the third side.

* * * * *